United States Patent [19]
Tults

[11] 4,084,127
[45] Apr. 11, 1978

[54] DIGITAL FREQUENCY DEVIATION DETECTOR USEFUL IN A TELEVISION TUNING SYSTEM

[75] Inventor: Juri Tults, Princeton Junction, N.J.

[73] Assignee: RCA Corporation, New York, N.Y.

[21] Appl. No.: 709,924

[22] Filed: Jul. 29, 1976

[51] Int. Cl.² ............................................. H03D 13/00
[52] U.S. Cl. ................................ 328/134; 328/129; 324/83 D
[58] Field of Search ................. 328/133, 134, 129; 324/83 A, 83 D

[56] References Cited

U.S. PATENT DOCUMENTS

| | | | |
|---|---|---|---|
| 3,579,104 | 5/1971 | Pignard et al. | 324/83 D |
| 3,579,126 | 5/1971 | Paul | 328/129 |
| 3,585,508 | 6/1971 | Crowther | 328/134 |
| 3,671,876 | 6/1972 | Oshiro | 328/134 |
| 3,683,345 | 8/1972 | Faulkes et al. | 324/83 D |
| 3,755,746 | 8/1973 | Hogue et al. | 328/134 X |
| 3,764,903 | 10/1973 | Griswold | 324/83 D |

*Primary Examiner*—John S. Heyman
*Attorney, Agent, or Firm*—Eugene M. Whitacre; Kenneth R. Schaefer; Peter M. Emanuel

[57] ABSTRACT

In a phase locked loop type of tuning system for a television receiver having provisions for tuning the receiver to non-standard frequency carriers having frequencies arbitrarily near respective frequencies of the standard broadcast carriers, a digital frequency deviation detector is provided to determine whether the frequency of at least one variable frequency signal developed by the tuning system is within a predetermined range of its nominal value. The frequency deviation detector includes a D type flip-flop to generate a signal whose frequency is equal to the difference between the frequency of the variable frequency signal and a fixed frequency signal. A counter is enabled during a predetermined portion of at least one cycle of the difference signal to count period (cycles) of the fixed frequency signal. The accumulation of at least a predetermined count indicates that the variable frequency signal is within a predetermined frequency difference with respect to the frequency of the fixed frequency signal. The frequency of the fixed frequency signal is substantially proportional to the nominal frequency of the variable frequency signal. Because the frequency deviation detector does not require components (e.g., capacitors) conventionally employed with analog type of frequency deviation detectors, it may be readily incorporated in a digital integrated circuit with, for example, other portions of a digital tuning system.

9 Claims, 6 Drawing Figures

DIGITAL FREQUENCY DEVIATION DETECTOR USEFUL IN A TELEVISION TUNING SYSTEM

The present invention relates to the field of television tuning systems and particularly relates to the field of frequency deviation detection circuits which may be utilized in television tuning systems.

Presently, much interest is being shown in tuning systems which utilize digital circuitry to accurately generate the local oscillator signals required to tune a television receiver to the various channels a viewer may select. Such systems may, for example, employ a phase locked loop to tune an oscillator to the nominal local oscillator frequencies corresponding to the standard broadcast channels in conjunction with a selectively enabled circuit to tune the oscillator to non-nominal local frequencies corresponding to non-standard frequency carriers, arbitrarily near respective broadcast frequencies, which may be generated by television signal distribution systems. Tuning systems of this type are described in copending U.S. application Ser. No. 662,096 entitled, "DUAL MODE FREQUENCY SYNTHESIZER FOR A TELEVISION TUNING APPARATUS", filed Feb. 27, 1976, in the name of Robert Morgan Rast and Ser. No. 688,521 entitled, "TELEVISION TUNING SYSTEM WITH PROVISIONS FOR RECEIVING RF CARRIER AT NON-STANDARD FREQUENCY", filed May 21, 1976, in the name of John Goodchilde Norie Henderson et al, each of which applications is assigned to the same assignee as the present application.

The tuning systems described in the above-mentioned patent applications each utilize at least one frequency deviation detector to determine when a variable frequency signal developed by the system has a frequency within a predetermined range of its nominal value. In order to reduce the size and facilitate the manufacture of such a tuning system, it is desirable to construct as much of it as possible in integrated circuit form. Therefore, it is desirable that a frequency deviation detector utilized in such a tuning system be compatible with integrated circuit technology. For example, where the tuning system is largely formed of digital logic circuitry, it is desirable that the frequency deviation detector utilize as few as possible (preferably none) of the non-integratable components conventionally employed in analog circuits, e.g., capacitors.

In accordance with the present invention, a digital frequency deviation detector suitable for a digital television tuning system includes means for generating a difference frequency signal having a frequency substantially equal to the difference between a variable frequency signal generated by the tuning system and a fixed reference frequency signal. A counter is enabled during a predetermined portion of at least one cycle of the difference frequency signal to count cycles of the fixed frequency signal. The count accumulated in the counter is representative of the frequency deviation between the variable and fixed frequency signals. Means are provided to generate a signal to indicate that the variable frequency signal is within a predetermined frequency difference with respect to the fixed frequency signal when a predetermined count has been accumulated in the counter.

In accordance with another feature of the present invention, the frequency of the fixed frequency signal is substantially equal to the nominal frequency of the variable frequency signal so that the frequency difference signal indicates that the frequency of the variable frequency signal is within the predetermined range from its nominal value.

In accordance with another feature of the present invention, at least two digital frequency deviation detectors are combined to share common elements and portions of the combination are selectively enabled so that at least two different frequency deviations may be detected.

Figure 1:
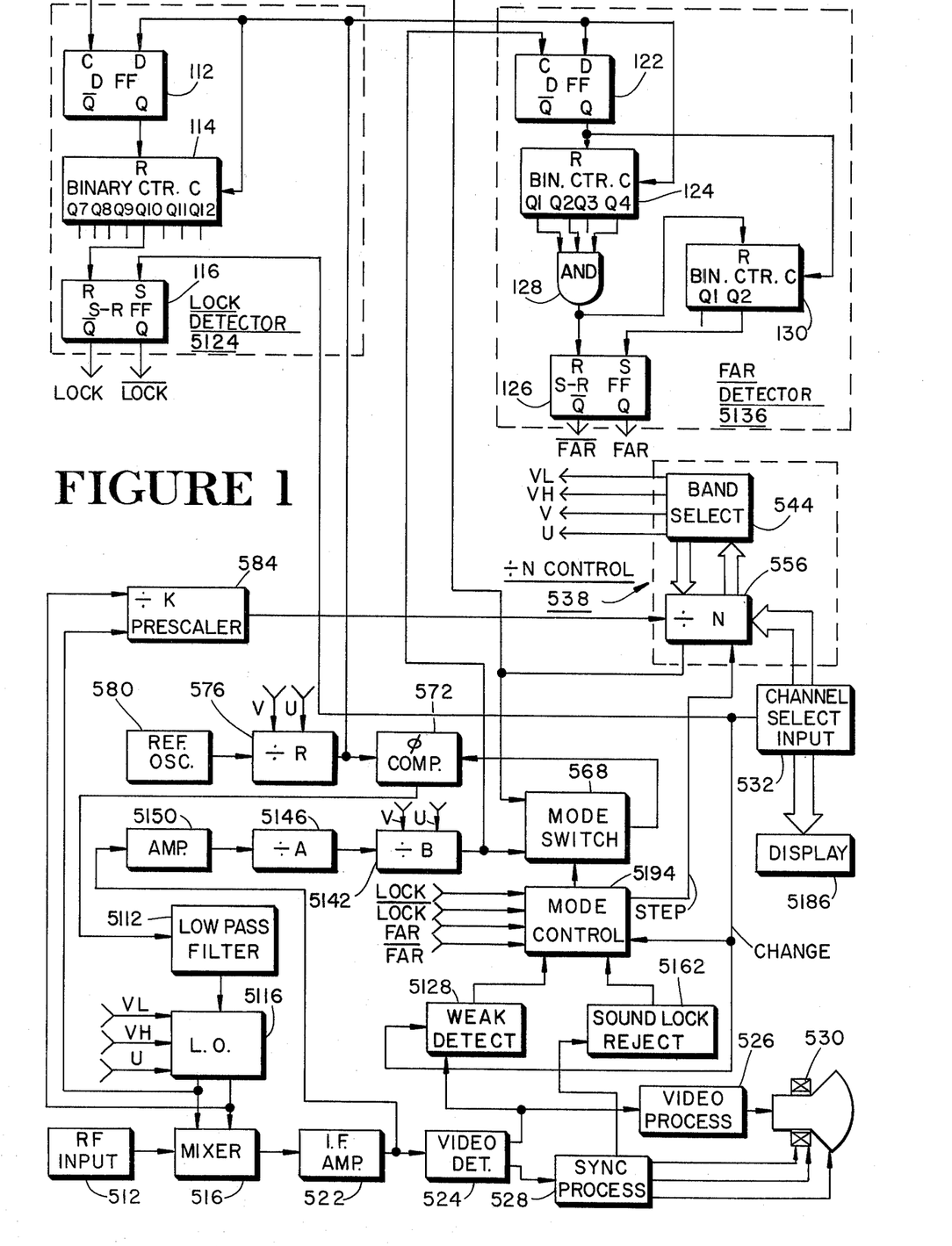
FIG. 1 shows partially in block diagram form and partially in logic diagram form a tuning system in which two frequency deviation detectors constructed in accordance with the present invention are employed.

The tuning system of FIG. 1 is of the dual mode type described in detail in the aforementioned Rast application, which application is hereby incorporated by reference. The units forming this tuning system are identified by reference numerals having "5" as a most significant digit with the remaining digits being the same as those for corresponding units in the Rast application. With the exception of lock detector 5124 and far detector 5136, the units of the tuning system of FIG. 1 may be formed in the same manner as the corresponding units in the Rast application. Lock detector 5124 and far detector 5136 are formed in accordance with the present invention and will be described after a brief description of the operation of the overall tuning system of FIG. 1.

When a viewer selects a channel by means of a channel select input 532, the selected channel number is displayed by a display unit 5186. A mode control unit 5194 causes a mode switch 568 to couple the output of a divide by N divider 556 to an input of a phase comparator 572. Operation of a first of coarse tuning phase locked loop is thereby initiated. The first phase locked loop controls the frequency of a local oscillator 5116 to provide a local oscillator signal having a nominal frequency corresponding to the selected channel which, when combined in a mixer 516 with a standard frequency broadcast carrier provided by an RF input unit 512, results in the generation of an IF signal having a picture carrier at the nominal picture carrier frequency, e.g., 45.75 MHz.

The first phase locked loop includes a reference oscillator 580, a divide by R divider 567, a phase comparator 572, a low pass filter 5112, local oscillator 5116, a divide by K prescaler 584, and divide by N divider 556. When the first phase locked loop is locked, i.e., when the frequency of the output signal of divide by R divider is substantially equal to the frequency of the output signal of divide by N divider 556, the local oscillator signal generated by local oscillator 5116 is defined by the following expression $$f_{LO} = (NK/R) f_{REF}$$

where $f_{LO}$ is the frequency of the local oscillator signal and $f_{REF}$ is the frequency of the reference frequency signal generated by reference oscillator 580. For frequency allocations in the United States, the nominal local oscillator frequencies reside in four separated bands between 101 and 931 MegaHertz (MHz). Assuming that $f_{REF}$ is chosen as 1 MHz, then: for channels in the VHF range K and R are equal to 16; for channels in the UHF range, K and R are 64 (i.e., 4 × 16); and the value of N is equal to the frequency in MHz of the nominal local oscillator frequency required to tune the receiver to the selected channel. To this end, the values of N and R are controlled in accordance with the channel selected.

Divide by N control unit 538 controls the value N by which divide by N divider 556 divides an in conjunction therewith determines the band in which the selected channel resides. Band select unit 544 of divide by N control unit 538 generates a "VL" band selection signal when the selected channel is in the range between channels 2 and 4, a "VH" band selection signal when the selected channel is in the range between channels 7 and 13, a "V" band selection signal when the selected channel is in the VHF range, i.e., between channels 2 and 13, and a "U" band selection signal when the selected channel is in the UHF band, i.e., between channels 14 and 83. A band select unit suitable for use in the tuning system of FIG. 1 is described in U.S. patent application Ser. No. 662,097 entitled, "PROGRAMMING UNIT FOR A TELEVISION PHASE LOCKED LOOP", filed in the name of Robert Morgan Rast on Feb. 27, 1976, and assigned to the same assignee as the present assignee. As is shown, the band selection signals are coupled to various portions of the tuning system to control their operating frequencies.

Under certain conditions, mode control unit 5194 will cause mode switch 568 to decouple the output signal of divide by N divider 556 from phase comparator in its place, to 572 and couple the output signal of a divide by B divider 5142 to phase comparator 572 to initiate the operation of a fine tuning or second phase locked loop. The second phase locked loop controls local oscillator 5116 so that the frequency deviation between an actual intermediate frequency picture carrier and its nominal value, e.g., 45.75 MHz, is minimized. A deviation between an actual picture carrier and 45.75 MHz may occur because the receiver is coupled to a system such as, for example, a master antenna television (MATV) distribution system, which provides non-standard frequency carriers which are translated in frequency from respective standard frequency broadcast carriers by an arbitrary amount (e.g., ±2 MHz).

The second phase locked loop includes reference oscillator 580, divide by R divider 576, phase comparator 572, a divide by B divider 5142, a divide by A divider 5146, an amplifier 5150, low pass filter 5112, local oscillator 5116, mixer 516 and intermediate frequency (IF) amplifier 522. With the values of $f_{REF}$ and R set forth above, A is equal to 4, for channels in the VHF range B is equal to 183 and for channels in the UHF range B is equal to 732 (i.e., 4 × 183). With these values, when the operation of the second phase locked loop is initiated, phase comparator 572 will supply control voltages to local oscillator 5116 so that the frequency (and phase) of the output signal of divide by R divider is substantially equal to the frequency (and phase) of the output signal of divide by B divider 5142. Under these conditions, the frequency of an actual IF picture carrier which is present will be substantially equal to its nominal value, e.g., 45.75 MHz.

The conditions under which the tuning system of FIG. 1 will transfer control between the first and second phase locked loops corresponds to control signals generated by a lock detector 5124, a weak detector 5128, a far detector 5136 and a sound lock reject unit 5162.

Lock detector 5124 generates a LOCK control signal to indicate that a phase locked loop has achieved lock, i.e., that the phase and frequency deviations between the output signals of divide by R divider 576 and divide by N divider 556 have been decreased below a predetermined value. A $\overline{\text{LOCK}}$ (the bar indicating the absence or complement of) control signal is generated when lock has not been achieved.

Weak detector 5128 generates a $\overline{\text{WEAK}}$ control signal when the amplitude of the noise component of the output signal of video detector 524 is below a predetermined noise threshold and a WEAK control signal when the amplitude of the noise component of the output signal of video detector 524 is above the predetermined threshold. As will be seen, the operation of the second phase locked loop is inhibited in response to the WEAK control signal since the logic elements comprising it may be susceptible to noise contained in a relatively weak video signal. Since MATV systems generally tend to provide relatively noise free or strong signals (typically greater than 1 millivolt), whereas relatively noisy or weak signals (e.g., less than 50 microvolts) may be provided by off-the-air reception systems, the predetermined noise threshold is selected such that when a WEAK control signal is generated, it is a strong indication that a standard frequency carrier is being provided by RF input unit 512 and therefore, a standard local oscillator signal may be provided by oscillator 5116.

Far detector 5136 generates a FAR control signal when the actual IF picture carrier, as manifested by the output signal of divide by B divider 5142, deviates by more than a predetermined amount (e.g., 1.5 to 2.0 MHz) from 45.75 MHz. Detector 5136 generates $\overline{\text{FAR}}$ control signal when the actual IF picture carrier is within the predetermined frequency deviation from 45.75 MHz.

When a channel is initially selected, in response to a CHANGE signal generated by channel select input 532, mode control unit 5194 initiates the operation of the first phase locked loop. Thereafter, when a LOCK control signal has been generated and if $\overline{\text{WEAK}}$ and $\overline{\text{FAR}}$ control signals are generated, indicating, respectively, that the first PLL has achieved lock (i.e., tuned the local oscillator to the nominal local oscillator frequency associated with the standard frequency carrier for the selected channel), that the IF signal is sufficiently free of noise to permit reliable operation of the second phase locked loop and that the actual carrier is within the predetermined frequency deviation from 45.75 MHz, mode control unit 5194 initiates the operation of the second phase locked loop and terminates the operation of the first phase locked loop.

However, if after a LOCK control signal has been generated, a FAR control signal is generated, mode control unit 5194 generates a STEP control signal which is coupled to divide by N control unit 538. The STEP control signal causes N to be decremented by 2, thereby causing the first phase locked loop to adjust the frequency of the local oscillator to a frequency 2 MHz below the nominal local oscillator frequency corresponding to the selected channel. This is done because, in a typical receiver, the IF circuits have an amplitude versus frequency transfer characteristic which is asymmetric around 45.75 MHz; i.e., signals above 45.75 are attenuated more than signals below 45.75. As a result, if the actual picture carrier is above 45.75 MHz, its presence may not have been detected. Therefore, the STEP control signal is generated so that the actual IF picture carrier is shifted downward by 2 MHz in order that it may pass through the IF circuits with sufficient amplitude to be detected. If after the generation of a STEP control signal by mode control unit 5194, LOCK, FAR and WEAK control signals are generated in response to the presence of an actual picture carrier in the IF passband, the operation of the first phase locked loop is inhibited and the operation of the second phase locked loop is initiated.

If at any time after the initiation of the operation of the second phase locked loop, a LOCK control signal is generated, due to, for example, a temporary signal receiving aberration due to so called "airplane flutter" or the like, the operation of the second phase locked loop is terminated and the operation of the first phase locked loop is reinitiated. After the temporary aberration abates, the operation of the second phase locked loop is again initiated. To minimize retuning time and the possibility of tuning error, when operation of the second phase locked loop is first initiated following a channel request, the state of STEP is preserved and not allowed to change until a new channel request has been entered.

Sound lock reject unit 5162 generates a SOUND LOCK control signal when the second phase locked loop has been locked to a sound carrier also, for example, due to a temporary receiving aberration. In response, the operation of the second phase locked loop is terminated and the operation of the first phase locked loop is re-initiated.

It should be noted that television distribution systems typically do not translate the frequency of UHF signals. Therefore, the operation of the second phase locked loop is only initiated when a VHF channel has been selected. Correspondingly, the detection circuits to be described are arranged for use when a VHF channel has been selected. It will be appreciated, however, that the detection circuits may be modified to make evaluations for channels in the UHF range as well as in the VHF range.

Figure 5:
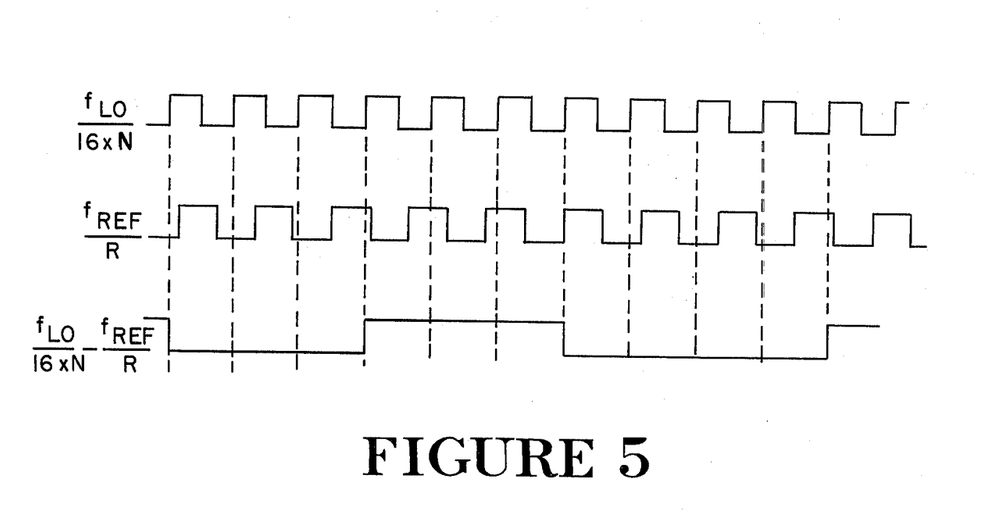
FIGS. 5 and 6 show graphical representations of waveforms useful in understanding the operation of the arrangements of FIGS. 1 and 3, respectively.

As earlier mentioned, lock detector 5124 determines when the frequency, $f_{LO}/(16 \times N)$, (K being equal to 16 for VHF channels), of the output signal of divide by N divider 556 (hereinafter divide by N output signal) is sufficiently close to the frequency, $f_{REF}/16$ (R being equal to 16 for VHF channels), of the output signal of divide by R divider 576 (hereinafter divide by R output signal) to consider the first phase locked loop locked. To this end, divide by R and divide by N output signals are respectively coupled to the D (data) and C (clock) inputs of a D flip-flop (F-F) 112 of lock detector 5124. Flip-flop 112 is a conventional type of D flip-flop whose Q (set) output, for each positive transition of the signal applied to its C input, assumes the logic level present at its D input. As is graphically illustrated in the timing diagram of FIG. 5, the Q output signal of D F-F 112 has a frequency which is equal to the difference between the frequencies of its two input signals.

The Q output signal of D F-F 112 is coupled to the reset (R) input of a binary counter 114 while the divide by R output signal is coupled to the C (clock) input of counter 114. Counter 114 is a conventional type of binary counter which comprises a cascaded series of bistable stages each having a set output representing a power of 2. Only set outputs Q7-Q12 of binary counter 114 are shown in FIG. 1. Set output Q7 corresponds to $2^6$, set output Q8 corresponds to $2^7$ and so on. The set outputs of binary counter 114 are set in binary steps in response to the sequential application of high (positive-going) pulses to its C input except when a high signal is applied to its R input. That is, binary counter 114 only counts the divide by R output signal during the negative-going or low half cycle of the frequency difference signal developed at the Q output of D F-F 112. The count in counter 114 will be directly proportional to the period and inversely proportional to the frequency of the difference signals supplied by F-F 112. If only output Q7 is set, $2^6 = 64$ cycles of the divide by R output signal have been counted during the low half cycle of the frequency difference signal while if only outputs Q7 and Q8 are set, $2^6 + 2^7 = 64 + 128 = 192$ cycles of the divide by R output signal have been counted during the low half cycle of the difference signal.

Thus, the higher the accumulated count, the smaller the difference in frequency between the variable frequency signal, here the divide by N output signal, and the fixed frequency signal, here the divide by R output signal.

The Q10 output of binary counter 114 is coupled to the reset (R) input of a set-reset (S-R) FF 116. When Q10 output is set to a high, the reset output ($\overline{Q}$) of S-R FF 116 is set high (LOCK) to indicate that the first phase locked loop is locked. When a viewer selects a new channel, channel select input 532 couples a CHANGE control signal to the set (S) input of S-R FF 116 to set its set output (Q) high ($\overline{LOCK}$), indicating that the first phase locked loop is not yet locked since a new channel has been selected.

Assuming that the values for $f_{REF}$, R, K. and N specified above are utilized, the selection of the Q10 output of counter 114 provides sufficient accuracy for the lock detection function. With the values of $f_{REF}$, R, K and N specified above, the divide by R output signal has a frequency of 1MHz/16 = 62.5 kilohertz (KHz) and a period of 1/62.5KHz = 16 microseconds. When the only Q10 output of counter 114 is set, $2^9 = 512$ cycles of the divide by R output signal have been counted. This corresponds to a duration of one half the period of the frequency difference signal which is equal to 8,192 microseconds (512 × 16 microseconds) since the count is accumulated in the negative-going or low half of the frequency difference signal. Therefore, the difference frequency is equal to 1/2 × 8,192 microseconds = 0.061 KHz. For channel 2 this corresponds to a frequency deviation from the nominal local oscillator frequency (101 MHz) of 101 × 16 × 0.061 KHz = 98.63 KHz or a deviation of 98.63 KHz/101 MHz = 0.097 percent. For channel 13, the difference frequency corresponds to a frequency deviation from the nominal local oscillator frequency (257 MHz) of 257 × 16 × 0.061 = 250.83 KHz or a deviation of 250.83 KHz/257 MHz = 0.0976 percent.

These deviations are sufficiently small to permit the operation of the second phase locked loop to be initiated with little likelihood that the second phase locked loop will tune the receiver to an undesired carrier (such as the lower adjacent sound carrier or the co-channel sound carrier) near a desired picture carrier. Furthermore, it is noted that since the variable frequency signal, i.e., the divide by N output signal, coupled to lock detector 5124 is a function of N, it would appear that it is theoretically necessary to modify the accumulated count required to reset S-R FF 116 with each channel. For example, from the above calculations, it can be seen that by selecting the Q10 output of binary counter 114 for channel 2, a LOCK signal will be generated at a deviation from nominal of 98.63 KHz while for channel 13 a LOCK signal will be generated at a deviation from nominal of 250.83 KHz. However, even the largest deviation, i.e., the deviation for channel 13, is sufficiently small to present no real difficulties in the lock detection application. Although the accuracy of lock detector 5124 is sufficient for use in the illustrated tuning system, it may be increased by utilizing a higher order output than the Q10 output of counter 114. For example, the Q11 output would result in doubling the system accuracy and the use of Q12 output would result in a quadrupled accuracy.

Furthermore, it is noted that it is the frequency difference signal developed at the Q output of D FF 112 which is utilized to enable binary counter 114 to count the divide by R output signal rather than utilizing the divide by R output signal to enable a counter to count the divide by N output signal or utilizing the divide by N output signal to enable a counter to count the divide by R output signal. This choice is desirable since the frequency difference signal has a long enough period, in comparison to the period of the divide by R or divide by N output signals, with small frequency differences to allow for a sufficiently large count to be accumulated to provide suitable resolution. If, for example, the divide by R output signal were utilized to enable a counter to count the divide by N output signal, relatively few cycles of the divide by N output signal could be counted during each period of the divide by R output signal. Of course, the period of the divide by R output signal could be increased by decreasing its frequency. This would require either decreasing the frequency of reference oscillator 580 or increasing the number of stages of divide by R divider 576. Increasing the number of stages of divide by R divider 576 would increase the cost and complexity of the tuning system. More importantly, however, decreasing the frequency of the divide by R output signal would increase the acquisition time of the tuning system.

Far detector 5136 of FIG. 1, as earlier mentioned, determines whether or not there is a carrier within the IF pass band, i.e., whether or not there is an IF carrier having a frequency within a predetermined deviation from the nominal picture carrier frequency, e.g., 45.75 MHz. To this end, the divide by R output signal, having a frequency of $f_{REF}/R$, and the output signal of divide by B divider 5142 (hereinafter divide by B output signal), having a frequency of $f_{IF}/A \times B$, are coupled to far detector 5136. With the values of $f_{REF}$, A add B given above, when there is no frequency deviation between the two signals, $f_{IF}$ is equal to 45.75 MHz.

Figure 6:
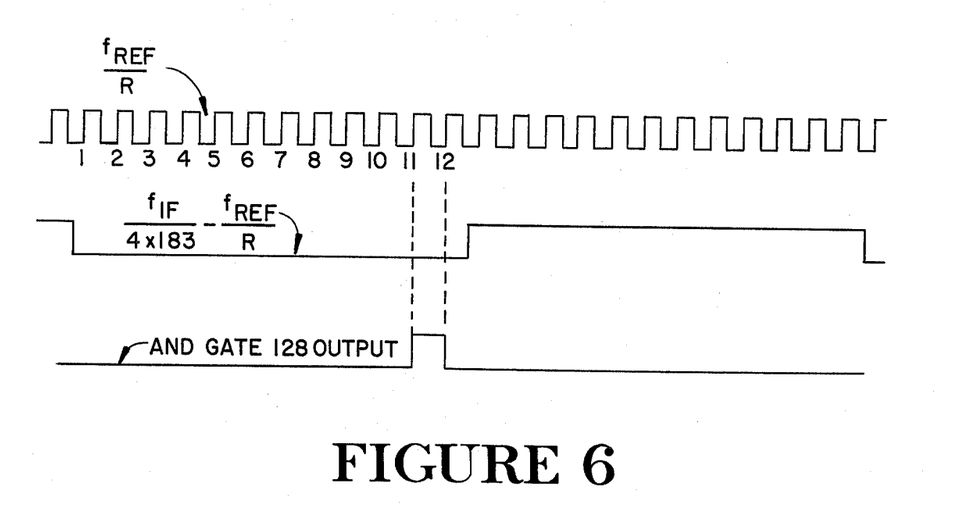

Far detector 5136 is formed in a manner similar to the manner in which lock detector 5124 is formed. A D FF 122 develops a signal at its Q output having a frequency equal to the difference between the frequencies of the outputs of divide by R 576 and divide by B 5142. A binary counter 124 counts the number of cycles of the divide by R output signal occurring during the negative going or low half cycle of the difference signal developed at the Q output of D FF 122. When a count of 11 has been accumulated, as is manifested by a high at the Q1, Q2 and Q4 outputs of binary counter 124 (i.e., $2^0 + 2^1 + 2^3 = 11$), an AND gate 128 couples a high signal (see FIG. 6) to the R input of an S-R FF 126 to set its $\overline{Q}$ output high (FAR) thereby indicating that there is an IF carrier within the predetermined deviation from 45.75 MHz.

A binary counter 130 is provided to set the Q output of S-R FF 126 and thereby generate a $\overline{FAR}$ control signal indicating that there is no IF carrier within the predetermined deviation from 45.75 MHz. The Q output of D flip-flop 122 and the output of AND gate 128 are coupled to the C and R inputs of binary counter 130, respectively. Binary counter 130 is incremented once for each cycle (period) of the frequency difference signal developed at the Q output of D FF 122 and reset each time a count of 11 is accumulated in binary counter 124. Therefore, for the Q2 ($2^1$) output of binary counter 130 to be set, two consecutive cycles of the difference frequency signal must occur without the accumulation of a count of 11 in binary counter 124. If the Q2 output of binary counter 130 is set, a high is coupled to the S input of S-R FF 126 and its Q output (FAR) is set high. Thus, binary counter 130 allows for the occurrence of a resonable number of measuring intervals, i.e., half cycles of the frequency difference signal, before an indication is given that there is no IF carrier within the IF passband.

Far detector 5136 exhibits a hysteresis effect in its generation of the FAR and $\overline{FAR}$ control signals. That is, for example, with the values of $f_{REF}$, R, A and B specified above and by utilizing a count of 11, a high FAR control signal indicates that the $f_{IF}$ is more than 2.080 MHz away from 45.75 MHz whereas a high $\overline{FAR}$ indicates that $f_{IF}$ is less than 2.287 MHz away from 45.75 MHz. This may be demonstrated by reference to the waveforms of FIG. 6. By shifting the phase of the frequency difference signal (i.e., shifting the frequency difference signal leftward or rightward in the diagram) with respect to the divide by R output signal the following observations may be made. A count of 11 is always accumulated when the duration of the low or negative-going half cycle of the difference signal is greater than 11 periods of the divide by R output signal, i.e., greater than 11 × 16 microseconds = 176 microseconds. Under these conditions, the frequency difference signal will have a frequency $f_D$ less than 1/2 × 176 microseconds = 0.00284 MHz. This corresponds to a deviation in $f_{IF}$ of 0.00284 MHz × 4 × 183 = 2.080 MHz. A count of 11 is never accumulated when the duration of the low half cycle of the frequency difference signal is less than or equal to 10 periods of the divide by R output signal, i.e., less than or equal to 10 × 16 microseconds = 160 microseconds. This corresponds to a deviation in $f_{IF}$ of 2.287 MHz. A count of 11 may thus be accumulated when the duration of $f_{IF}$ is greater than 2.080 MHz and less than 2.287 MHz. However, under any circumstances when a count of 11 has been accumulated, far detector 5136 provides an indication that there is an IF carrier within 2.287 MHz of the nominal value.

For the present tuning system application, this hysteresis effect is acceptable since it is assumed that the maximum deviation of a non-standard radio frequency carrier from a corresponding standard radio frequency carrier is 2 MHz. This means that an adjacent channel sound carrier to which the receiver may be undesirably tuned can be no closer than 2.5 MHz from 45.75 MHz. If a carrier is detected within the IF passband which is within 2.5 MHz of 45.75 MHz, it will be the picture carrier for the selected channel rather than the sound carrier for the selected or adjacent channels even when the picture carrier frequency is offset from its nominal value by an amount approaching 2 MHz.

If desired, the hysteresis effect may be reduced by increasing the frequency of the divide by R output signal and increasing the number of stages of binary counter 124. For example, by increasing the frequency of the divide by R output signal and detecting a count of 21 rather than 11, the FAR and $\overline{FAR}$ control signals, respectively, correspond to deviations of $f_{IF}$ of 2.178 and 2.287 MHz, respectively.

Figure 2:
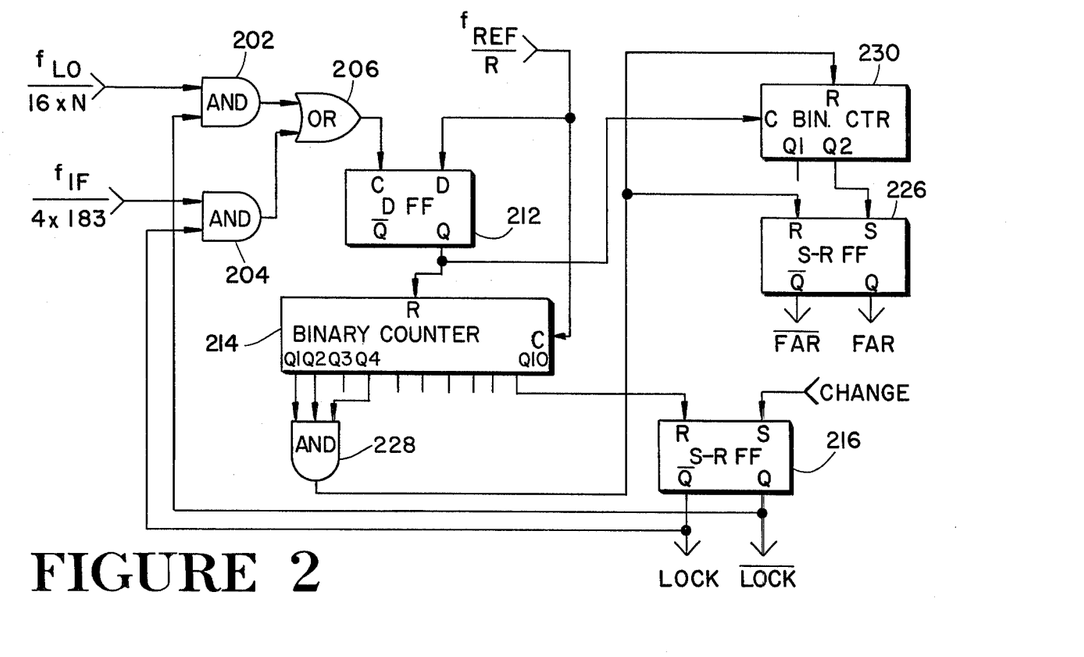
FIG. 2 shows in logic diagram form a frequency deviation detector of which appropriate portions are selectively enabled to provide the functions separately provided by the two frequency detectors of FIG. 1.

The arrangement of FIG. 2 provides each of the functions of lock detector 5124 and far detector 5136 of FIG. 1 by selectively coupling either the divide by N output signal or the divide by B output signal, respectively associated with the lock detection and far detection functions to a D FF 212 through a gating network comprising AND gates 202 and 204 and OR gate 206. D FF 212 develops a signal at its Q output whose frequency is equal to the difference in frequency between the divide by R output signal and one of the two variable frequency signals. A binary counter 214 accumulates a count in accordance with the number of periods (cycles) of the divide by R output signal which occur in the low or negative-going half period of the frequency difference signal. The Q1, Q2, and Q4 outputs of binary counter 214 are coupled to S-R FF 226 and binary counter 230 by an AND gate 228. These latter three elements correspond to AND gate 128, S-R FF 126 and binary counter 130, respectively, of far detector 5136 of FIG. 1. The Q10 output of binary counter 214 is coupled to S-R FF 216 which corresponds to S-R FF 126 of lock detector 5124 of FIG. 1. The LOCK and $\overline{LOCK}$ output signals of S-R FF 216 are coupled to AND gates 202 and 204 respectively so that after the first phase locked loop has achieved lock, the divide by N output signal is decoupled from D FF 212 and the divide by D output signal is coupled to D FF 212 instead. Thereafter, the arrangement serves as a far detector to develop either a FAR or a $\overline{FAR}$ signal at the output of S-R FF 226.

Figure 3:
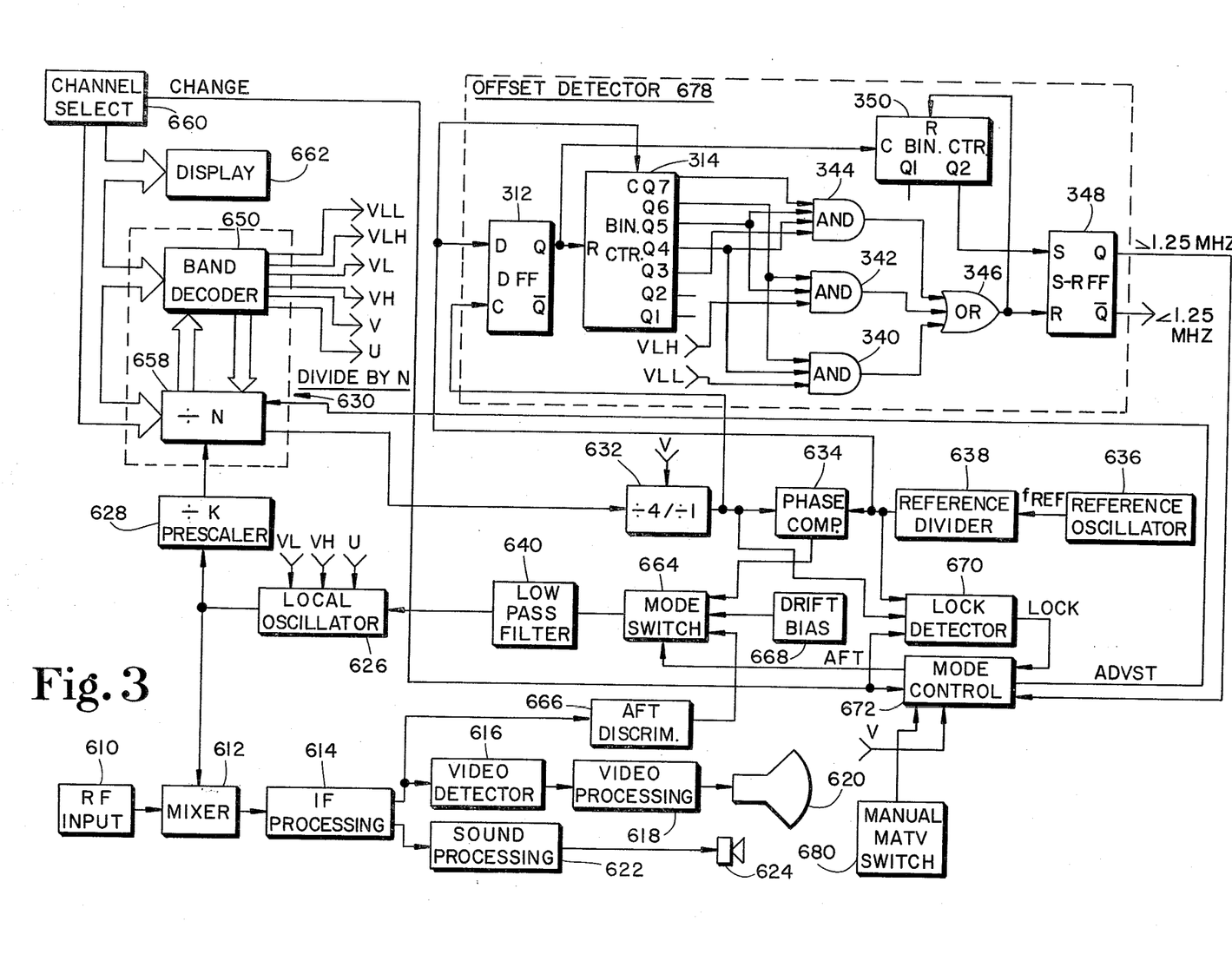
FIG. 3 shows partially in block diagram form and partially in logic diagram form another television tuning system in which another frequency deviation detector is employed.

Another application of the described frequency deviation detector in a television tuning system is shown in FIG. 3. The tuning system of FIG. 3 comprises the type of tuning system described in the afore-mentioned Henderson et al. application which is hereby incorporated by reference. The functions of the various units of the tuning system of FIG. 3 are similar to the functions of corresponding units of the tuning system of the Henderson et al. application. For that reason, the units of the tuning system of FIG. 3 are identified by reference numbers with "6" as their most significant digit and with their lower significant digits being the same as the reference numbers of corresponding units of the tuning system of the Henderson et al. application.

The tuning system of FIG. 3 includes a phase lock loop comprising a reference oscillator 636, a reference divider 638, a phase comparator 634, a low pass filter 640, a local oscillator 626, a divide by K prescaler 628, a divide by N divider 658 and a divide by 4/divide by 1 divider 632. When a channel is initially selected by a viewer by means of a channel select unit 660, a mode switch 664 under the control of a mode control unit 672 couples the output of phase comparator 634 to the input of low pass filter 640 to initiate the operation of the phase locked loop. Substantially simultaneously the value N is set, as in the tuning system of FIG. 1, to a value equal to the frequency in megahertz of the nominal local oscillator for the selected channel and a band decoder 650 determines which band the selected channel is in. Band decoder 650 develops one of six control signals: VLL for channels 2-4; VLH for channels 5-6; VL for channels 2-6; VH for channels 7-13; V for the the VHF channels, i.e., for channels 2-13; and U for the UHF channels, i.e., channels 14-83. These signals are coupled to various portions of the tuning system to control their frequency of operation. The division factors for the various dividers comprising the phase locked loop are selected so that for each selected channel, when the loop is locked, the output signals of reference divider 638 and divide by 4/divide by 1 divider 632 are equal. Assuming that the frequency of reference oscillator 636 is chosen as 1 MHz, and reference divider 638 divides by 16, the frequency of the output signal of divide by 4/divide by 1 divider 632 is equal to the frequency of the output signal of divide by N divider 556 of FIG. 1 and the frequency of the output signal of reference divider 638 is equal to the frequency of the output signal of divide by R divider 576 of FIG. 1.

The phase locked loop of the tuning system of FIG. 3 provides the nominal frequency local oscillator signal required to tune the receiver to the standard broadcast frequency carriers associated with the selected channel. So that the tuning system of FIG. 3 may tune the receiver to a non-standard frequency carrier, offset in frequency from the standard frequency carrier associated with the selected channel, the tuning system of FIG. 3 includes an AFT (automatic fine tuning) discriminator 666 and a drift bias unit 668 which are selectively coupled to low pass filter 640 by mode switch 664 after the generation of a LOCK signal, indicating that the phase locked loop is locked, by a lock detector 670. Thereafter, AFT discriminator 666, in conjunction with drift bias unit 668, causes the local oscillator frequency to be controlled to reduce any deviation between an actual picture carrier and 45.75 MHz. Drift bias unit 668 insures a controlled scan of the IF pass band in a predetermined direction.

Because AFT discriminator 666 is capable of tuning the receiver to an undesirable carrier, such as a sound carrier, it is desirable to determine how far the frequency of local oscillator 626 has drifted from its nominal frequency for the selected channel synthesized under phase locked loop control. To this end, offset detector 678 is provided to determine if the frequency of the local oscillator has drifted beyond a predetermined offset of the nominal local oscillator frequency for the selected channel. The predetermined offset is chosen with respect to the closest expected undesirable carrier and the pull-in capability of a suitable AFT discriminator. For example, for the frequency allocations utilized in the United States and an AFT discriminator having a specified pull-in range of ±1 MHz, the predetermined offset is desirably selected as 1.25 MHz because it is less than the frequency spacing, e.g., 1.5 MHz, between the lower adjacent sound carrier and the picture carrier of the selected channel and slightly greater than the specified pull-in range of a suitable discriminator, e.g., ±1 MHz, so as to allow a margin for overshooting the picture carrier to be tuned.

If the predetermined offset if exceeded, the operation of the phase locked loop is reinitiated and the nominal local oscillator frequency is modified so that an adjacent portion of the IF range may be searched for a picture carrier without tuning the receiver to an undesired carrier. To this end, a mode control unit 672 generates an advance (ADVST) signal to incrementally change the value of N if offset detector 678 determines that the local oscillator frequency has drifted farther than the predetermined offset from its nominal value.

A manual MATV switch 680 is provided so that a viewer may enable the tuning system of FIG. 3 to tune the receiver to nonstandard frequency carriers. Furthermore, as in the tuning system of FIG. 1, the nonstandard carrier frequency tuning portion of the tuning system of FIG. 3 is disabled from operating when a UHF channel has been selected since generally the frequencies of MATV RF carriers are not translated in frequency in the UHF range.

Thus, the tuning system of FIG. 3 includes at least two circuits which serve to determine when a variable frequency signal has a frequency above or below a nominal value. Lock detector 670 serves to detect when the output of the divide by 4/divide by 1 divider 632 is sufficiently close to the frequency of the output signal of reference divider 638 so that the phase locked loop may be considered locked. Offset detector 678 determines when the frequency of the local oscillator has drifted beyond the predetermined offset from its nominal value synthesized when the tuning system is under phase locked loop control.

Lock detector 670 may be formed in a manner similar to the manner in which the lock detector 5124 of FIG. 1 is formed.

Since each nominal local oscillator signal has a frequency related to the frequency of the output signal of reference divider 638 by the particular value of or for that channel when the phase locked loop of the tuning system of FIG. 3 is locked, offset detector 678 determines how far the frequency of the local oscillator signal has drifted from its nominal (i.e., locked) frequency by comparing the frequency of the local oscillator signal with the frequency of the output signal of reference divider 638. To this end, the output signal of reference divider 638 is coupled to the D input of D FF 312 while the output signal of divide by 4/divide by 1 divider 632 is coupled to its C input. The frequency difference signal developed at the Q output of D FF 312 is coupled to the R terminal of a binary counter 314. The output signal of reference divider 638 is coupled to the C input of binary counter 314. Binary counter 314 counts the number of periods (cycles) of the output signal of reference divider 638 occurring during the low or negative-going half cycle of the frequency difference signal.

Three AND gates 340, 342 and 344 are coupled to various set outputs of binary counter 314. AND gate 340, if enabled by a high VLL band selection signal generates a high when a count of 40 ($2^3 + 2^5$) has been reached. AND gate 342, if enabled by a high VLH signal, generates a high when a count of 48 ($2^4 + 2^5$) has been reached. AND gate 344 generates a high when a count of 92 ($2^2 + 2^3 + 2^4 + 2^6$) has been reached. If any of the three AND gates 340, 342, and 344 go high, a high is coupled to the R input of an S-R FF 348 through an OR gate 346. In response, the $\overline{Q}$ (reset) output of S-R FF 348 is set high indicating that the offset of the local oscillator frequency has not drifted beyond the predetermined offset.

A binary counter 350 is provided to determine whether or not any of the counts detected by AND gates 340, 342 or 344 have been reached within a reasonable number of periods of the frequency difference signal generated at the Q output of D flip-flop 312. Each time the frequency difference signal becomes a high, binary counter 350 is clocked. However, each time a predetermined count associated with one of AND gates 340, 342 or 344 is reached, binary counter 350 is reset. Thus, for the Q2 output of binary counter to be set, two ($2^1$) consecutive periods of the frequency difference signal must occur without the occurrence of one of the predetermined counts. Under these conditions, the Q (set) output S-R FF 348 is set high indicating that the predetermined offset has been exceeded.

Since the variable frequency input signal to offset detector 678 is a function of N, i.e., of the selected channel, the predetermined accumulated count to determine whether the frequency of the local oscillator signal has drifted beyond the predetermined offset should theoretically be a function of the selected channel. However, as will be demonstrated, sufficient accuracy for the offset detection application is provided if the predetermined count is changed for each band in the VHF range (the offset detection function not being utilized for UHF channels). Thus, AND gate 340 is provided for the offset evaluation on the VLL band (channels 2-4), AND gate 342 is provided for the offset evaluation in the VLH band (channels 5-6), and AND gate 344 is provided for the offset evaluation in the VH band (channels 7-13). It is noted that although AND gates 342 and 340 are gated by respective band selection signals, 344 is not because if VLL and VLH are not high, it follows that a channel in the VH band has been selected.

As is the case with the FAR and $\overline{\text{FAR}}$ indications provided by far detector 5136 of FIG. 1, the offset indicating signals labelled >1.25 MHz and <1.25 MHz provided by offset detector 678 of FIG. 1 exhibit a hysteresis effect. This may be demonstrated by considering the offset evaluation for channel 2 where the predetermined count to provide a <1.25 MHz indication is 40. A count of 40 is always reached when the duration of the low half cycle of the frequency difference signal is longer than the duration of 40 periods of the output signal of reference divider 638, i.e., is greater than $40 \times 16$ microseconds = 640 microseconds. This duration corresponds to a frequency difference signal having a frequency equal to 0.000781 MHz and a deviation of $f_{LO}$ of $16 \times 101 \times 0.000781$ MHz = 1.262 MHz. A count of 40 is never reached, and therefore a >1.25 MHz signal is generated, when the duration of the low half cycle of the frequency difference signal is no longer than the duration of 39 periods of the output signal of reference divider 638, i.e., is less than $39 \times 16$ microseconds = 624 microseconds. This corresponds to a deviation in $f_{LO}$ of $16 \times 101 \times 0.000801$ MHz = 1.294 MHz.

Although there is some error in the 1.25 determination, the accuracy provided by offset detector 678 is more than sufficient for its use in the tuning system of FIG. 3 since the closest undesirable carrier is 1.5 MHz from the desired picture carrier. Therefore, the operation of the phase locked loop will be reinitiated at a modified value of N well before (i.e., at 1.265 MHz) the range of an undesirable carrier is reached.

As earlier mentioned, it is reasonable to expect that since the frequency of the variable frequency input signal, i.e., the output signal of divide by 4/divide by 1 divider 632, is a function of N, different predetermined counts should be utilized for each channel. However, by providing a different predetermined count for each band in the VHF range (the offset detection function not being utilized for channels in the UHF range), sufficient accuracy is provided for each channel in the band. For example, 40 is the predetermined count for the entire VLL band. The frequency deviation detectable when channel 2 is selected is described above. The frequency of the difference frequency signal developed at the Q output of D FF 312 for channel 2 is the same as for channel 4. For channel 4, a count of 40 is always reached when the frequency deviation of $f_{LO}$ is $16 \times 113 \times 0.000781 = 1.412$ MHz. A count of 40 is never reached when the frequency deviation of $f_{LO}$ is $16 \times 113 \times 0.000801 = 1.448$ MHz. These deviations are sufficiently below the 1.5 MHz to ensure that an undesirable carrier will not be tuned. Similar results are obtained for channel 3. Thus, by choosing 40 as the predetermined count for the entire VLL band sufficient accuracy is provided without requiring a different predetermined offset count for each channel.

Figure 4:
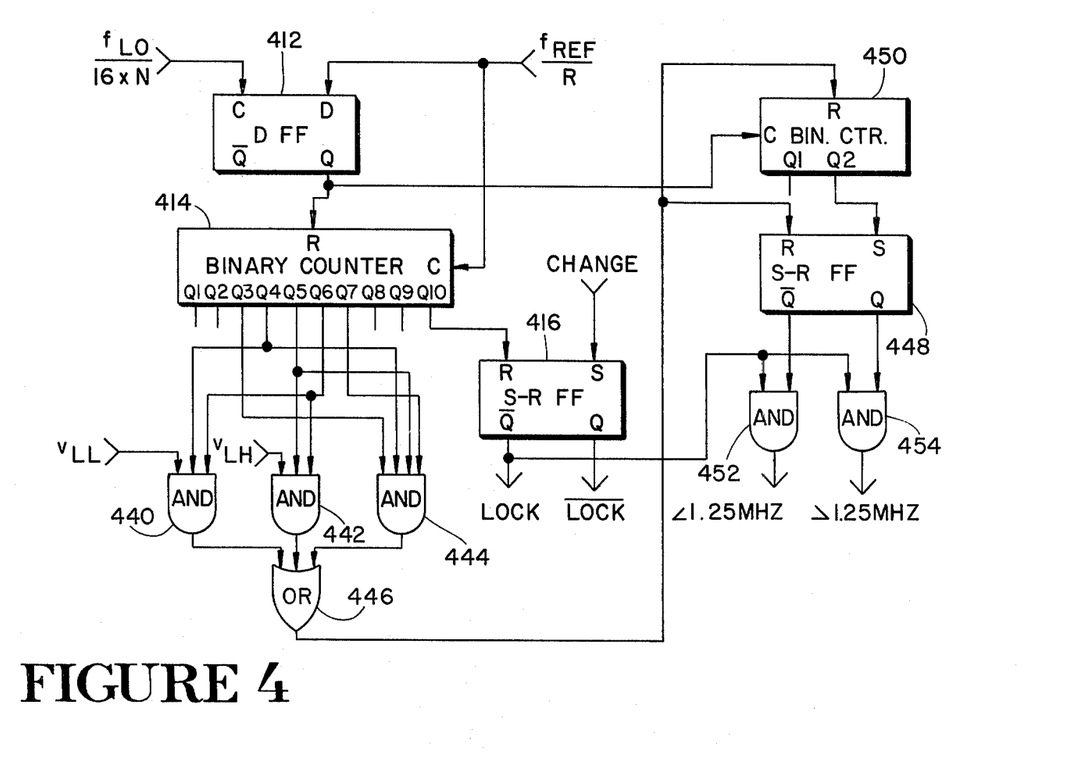
FIG. 4 shows in logic diagram form how a frequency deviation detector, of which appropriate portions are selectively enabled to provide two functions, is utilized in the tuning system of FIG. 3.

The arrangement of FIG. 4 provides both an indication of when the phase locked loop of the tuning system of FIG. 3 is locked and when the frequency of the local oscillator has drifted beyond the predetermined deviation from the value synthesized under phase locked loop control. D FF 412 and binary count are shared to perform both evaluations while S-R FF 416, corresponding to S-R FF 116 of FIG. 1 is utilized to provide the lock detection function and AND gate 440, AND gate 442, AND gate 444, OR gate 446, S-R FF 448 and binary counter 450, corresponding, respectively, to AND gate 340, AND gate 342, AND gate 344, OR gate 346, S-R FF 348 and binary counter 380 of FIG. 3, provide the offset detection function. AND gates 452 and 454 are utilized to enable the offset detection outputs after the phase locked loop is locked.

Thus, there has been described digital frequency deviation detectors which do not utilize components, such as capacitors, utilized in a convention frequency deviation detector. It should be appreciated that although the arrangement was described in terms of specific embodiments, modifications thereof are contemplated to be within the scope of the present invention. For example, decade counters may be utilized in place of the binary counters although a decade counter would generally require more stages and are more complex than a binary counter for the same application.

What is claimed is:
1. Apparatus comprising:
  means for generating a fixed frequency signal having a frequency proportional to a reference frequency;
  means for generating a variable frequency signal;
  means for generating a frequency difference signal having a frequency substantially equal to the difference in frequency between said fixed and variable frequency signals;
  means for counting cycles of said fixed frequency signal occurring during a predetermined portion of at least one cycle of said frequency difference signal;
  means for generating a first signal when the count accumulated in said counting means exceeds at least a first predetermined count and for generating a second signal when said first predetermined count is not exceeded; and
  means for delaying the generation of said second signal until a predetermined number of cycles of said frequency difference signal have occurred.
2. The apparatus recited in claim 1 wherein the frequency of said fixed frequency signal is related to the nominal value of the frequency of said variable frequency signal.
3. The apparatus recited in claim 1 wherein said means for generating said frequency difference signal is a D type flip-flop.
4. The apparatus recited in claim 1 wherein said counting means is a binary counter.
5. The apparatus recited in claim 1 wherein said means for delaying the generation of said second signal includes a binary counter.
6. Apparatus comprising:
  means for generating a fixed frequency signal having a frequency proportional to a reference frequency;
  means for generating a variable frequency signal;
  means for generating a frequency difference signal having a frequency substantially equal to the difference in frequency between said fixed and variable frequency signals;
  means for counting cycles of said fixed frequency signal occurring during a predetermined portion of at least one cycle of said frequency difference signal;
  means for generating a first signal when the count accumulated in said counting means exceeds a selected one of at least two predetermined counts and for generating a second signal when said selected one predetermined count is not exceeded; and
  means for controlling the selection of said predetermined counts in response to respective control signals.
7. The apparatus recited in claim 6 wherein said means for generating said variable frequency signal includes means for generating a local oscillator signal for tuning a receiver which is partitioned into frequency bands, said control signals corresponding to respective frequency bands.
8. Apparatus comprising:
  means for generating a fixed frequency signal having a frequency proportional to a reference frequency;
  means for generating a variable frequency signal;
  means for generating a frequency difference signal having a frequency substantially equal to the difference in frequency between said fixed and variable frequency signals;
  means for counting cycles of said fixed frequency signal occurring during a predetermined portion of at least one cycle of said frequency difference signal;
  means for generating a first signal when a first predetermined count is accumulated in said counting means and a second signal when said first predetermined count is not accumulated in said counting means; and
  means for selectively enabling in response to one of said first and second signals the generation of a third signal when a second predetermined count is accumulated in said counting means and a fourth signal when said second predetermined count is not accumulated in said counting means.
9. The apparatus recited in claim 8 wherein said means for selectively enabling the generation of said third and fourth signals includes means for selectively coupling a second variable frequency signal to said counting means in response to one of said first and second signals.

* * * * *